US011644861B2

(12) United States Patent
Kato et al.

(10) Patent No.: US 11,644,861 B2
(45) Date of Patent: May 9, 2023

(54) INFORMATION PROCESSING APPARATUS INCLUDING FUNCTION BLOCKS AND GENERATION UNITS

(71) Applicant: CANON KABUSHIKI KAISHA, Tokyo (JP)

(72) Inventors: Yasuhiro Kato, Tokyo (JP); Koichi Morishita, Kodaira (JP); Takuya Minakawa, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 277 days.

(21) Appl. No.: 16/844,238

(22) Filed: Apr. 9, 2020

(65) Prior Publication Data
US 2020/0333826 A1 Oct. 22, 2020

(30) Foreign Application Priority Data

Apr. 19, 2019 (JP) .............................. JP2019-080468

(51) Int. Cl.
G06F 1/12 (2006.01)
G06F 1/08 (2006.01)
H03L 7/06 (2006.01)

(52) U.S. Cl.
CPC .................. G06F 1/12 (2013.01); G06F 1/08 (2013.01); H03L 7/06 (2013.01)

(58) Field of Classification Search
CPC .................. G06F 1/12; G06F 1/08; H03L 7/06
See application file for complete search history.

(56) References Cited

U.S. PATENT DOCUMENTS

| 4,979,190 A * | 12/1990 | Sager ...................... H04L 25/14 375/362 |
| 8,103,897 B2 * | 1/2012 | Endo .......................... H03L 7/00 713/502 |
| 9,898,035 B2 | 2/2018 | Yoshiki |
| 2010/0253409 A1 * | 10/2010 | Yeh ............................ G06F 1/10 327/295 |
| 2010/0308874 A1 * | 12/2010 | Seki ........................... G06F 1/08 327/115 |
| 2011/0131442 A1 * | 6/2011 | Watanabe ........... G06F 11/3636 713/502 |
| 2011/0292950 A1 * | 12/2011 | Nguyen .................... H03L 7/23 370/537 |
| 2015/0061779 A1 * | 3/2015 | Kim .......................... G06F 1/08 331/25 |

(Continued)

FOREIGN PATENT DOCUMENTS

JP H07121261 A 5/1995
JP 2008124966 A 5/2008
(Continued)

Primary Examiner — Zahid Choudhury
(74) Attorney, Agent, or Firm — Rossi, Kimms & McDowell LLP

(57) ABSTRACT

There is provided with an information processing apparatus. A plurality of functional blocks are in synchronization relationship. Each of a plurality of generation units comprises a counter and a frequency division circuit. The frequency division circuit frequency-divides a reference clock based on a value of the counter. Each of the plurality of generation units supplies a clock generated using the reference clock to a corresponding functional block among the plurality of functional blocks.

20 Claims, 7 Drawing Sheets

(56) References Cited

U.S. PATENT DOCUMENTS

2015/0241905 A1* 8/2015 Pessa ..................... G06F 1/08
                                                          713/502

FOREIGN PATENT DOCUMENTS

| JP | 2015015540 | A | | 1/2015 | |
|----|------------|---|---|--------|---|
| JP | 2016152448 | A | | 8/2016 | |
| WO | WO-2010038459 | | * | 4/2010 | .......... G06F 11/3608 |

* cited by examiner

INFORMATION PROCESSING APPARATUS INCLUDING FUNCTION BLOCKS AND GENERATION UNITS

BACKGROUND OF THE INVENTION

Field of the Invention

The present invention relates to an information processing apparatus, and in particular relates to clock supply in an integrated circuit.

Description of the Related Art

Usually, in circuits, data is passed/received in synchronization with a clock. When designing such a circuit, timing design is implemented so as to achieve timing convergence in all of the synchronous paths in consideration of delay times of clocks and data. For example, when data is passed/received between flip flop (FF) circuits, it is required to satisfy the setup/hold time constraints of the FFs in order to pass/receive data properly.

A clock that is supplied to a circuit is generated by a clock generator. In a representative configuration, a clock generator is disposed on a chip top layer. The clock generator may change a clock frequency and switch on/off a clock for each functional block to which the clock is to be supplied, as necessary. A clock generated by the clock generator is supplied to functional blocks through interconnects on the chip top layer, and is further distributed to FFs in the respective functional blocks. CTS (clock tree synthesis) is used as a technique for implementing physical clock routing so as to equalize delay times until a clock reaches functional blocks or FFs from a clock source. By reducing the delay time difference of clocks (clock skew), timing design can be implemented easily.

In recent years, as the performance and the functionality of information devices such as digital cameras and smart phones are becoming higher, the scale of circuits (for example, integrated circuits such as LSIs) of information processing apparatuses increases. Therefore, distances from the clock source to functional blocks or FFs have also increased, and clock delay times have extended. On the other hand, as processes are becoming finer, the influence that the delay difference between elements or interconnects on the same chip has on a clock delay time has increased. Specifically, even if routings for a clock that passes through different routes are set to be equally long, a clock skew increases under the influence of the delay difference. Particularly, delay difference caused by long-distance routings on a chip top layer has great influence on timing design. On the other hand, the frequencies of clocks used in circuits have been increasing. Under these influences, timing design for passing/receiving data in synchronization with a clock between circuit blocks has become more difficult.

Japanese Patent Laid-Open No. 2016-152448 proposes implementing routings on a chip top layer such that a clock generated by a clock generator frequency-dividing a reference clock is latched by FFs that operate in accordance with the reference clock before frequency division, and thereby reducing the influence of delay difference.

SUMMARY OF THE INVENTION

According to an embodiment of the present invention, an information processing apparatus comprises: a plurality of functional blocks that are in synchronization relationship; and a plurality of generation units each comprises a counter and a frequency division circuit, the frequency division circuit being configured to frequency-divide a reference clock based on a value of the counter, wherein each of the plurality of generation units is configured to supply a clock generated using the reference clock to a corresponding functional block among the plurality of functional blocks.

Further features of the present invention will become apparent from the following description of exemplary embodiments (with reference to the attached drawings).

DESCRIPTION OF THE EMBODIMENTS

Figure 1:
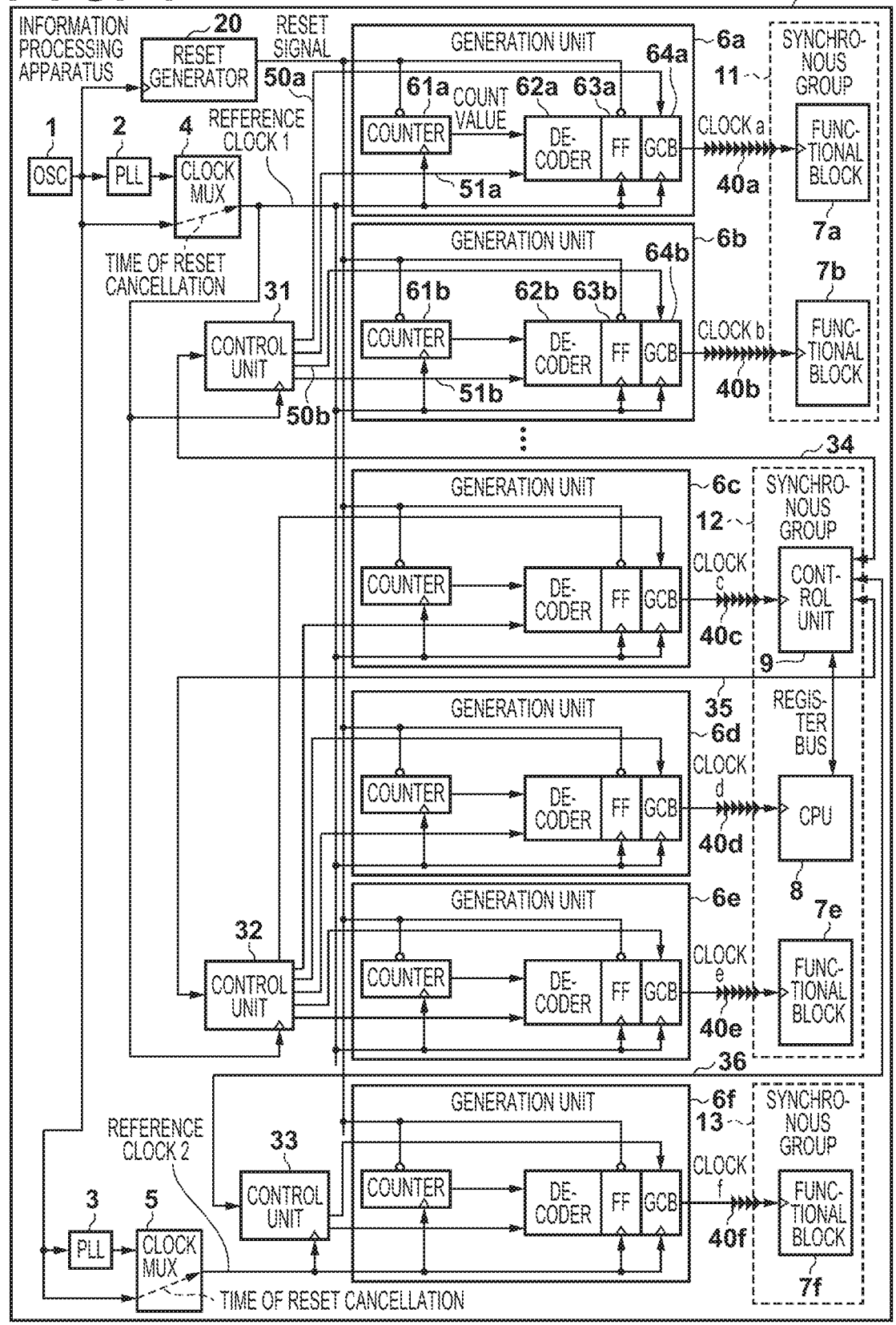
FIG. 1 is a diagram of a system configuration of an information processing apparatus according to an embodiment of the present invention.

The method of Japanese Patent Laid-Open No. 2016-152448 can be applied when generating a clock from a reference clock such that the pulse width of the clock is twice or larger than the pulse width of the reference clock, but cannot be applied when generating a clock by reducing the number of pulses of a reference clock without changing the pulse width.

One embodiment of the present invention provides a new technique for supplying a clock to functional blocks, the technique being aimed at easy implementation of timing design in a configuration for passing/receiving data between the functional blocks.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate.

Furthermore, in the attached drawings, the same reference numerals are given to the same or similar configurations, and redundant description thereof is omitted.

First, a configuration example of an information processing apparatus 100 according to an embodiment of the present invention will be illustrated with reference to FIG. 1. In the present specification, embodiments of the present invention will be described with reference to the information processing apparatus 100 shown in FIG. 1. However, it should be noted that, in the present invention, all of the constituent elements of the information processing apparatus 100 are not necessary.

The information processing apparatus 100 shown in FIG. 1 is a semiconductor apparatus called "system on chip", and can be called "semiconductor integrated circuit". The blocks in the information processing apparatus 100 shown in FIG. 1 may be, for example, circuits that exert respective functions thereof. Applications of the information processing apparatus 100 are not particularly limited, and the information processing apparatus 100 includes functional blocks that perform processing for realizing functions suitable for applications, as will be described later. The information processing apparatus 100 may also be, for example, an information processing apparatus for a digital camera system.

The blocks in the information processing apparatus 100 are connected to each other via a bus system. Such a bus system may be a system called "interconnect", "fabric", "on-chip network", or "network on-chip". A plurality of functional blocks that respectively perform specific processes are connected to the bus system. The information processing apparatus 100 according to an embodiment of the present invention has a function of receiving video image data from an external sensor (not illustrated), a function of transferring video image data to a DRAM (not illustrated) via the bus system, and a function of processing video image data and storing the processed data to the DRAM. Functional blocks 7a to 7f shown in FIG. 1 respectively perform processes for realizing at least some of these functions and other functions. In addition, a CPU 8 that is one of the plurality of functional blocks, and performs overall control of processing that is performed by the information processing apparatus 100 is also connected to the bus system.

A configuration for supplying, to functional blocks, a clock to be used for the functional blocks to operate in the information processing apparatus 100 will be described below. The information processing apparatus 100 also includes a mechanism for generating (or oscillating) a clock signal, and this mechanism may be capable of supplying a low-speed clock and a high-speed clock as shown in FIG. 1.

In FIG. 1, an oscillator 1 generates a low-speed clock. In addition, a PLL 2 and a PLL 3 output a high speed clock whose frequency is higher than a low-speed clock, using a low-speed clock generated by the oscillator 1, for example, by multiplying the low-speed clock. A clock MUX 4 selects a low-speed clock generated by the oscillator 1 or a high-speed clock generated by the PLL 2, and supplies the selected clock to generation units 6a to 6e and control units 31 and 32 that are positioned at later stages. Also, a clock MUX selects a low-speed clock generated by the oscillator 1 or a high-speed clock generated by the PLL 3, and supplies the selected clock to a generation unit 6f and a control unit 33 that are positioned at later stages. In the present specification, a clock selected by the clock MUX 4 is referred to as a "reference clock 1", and a clock selected by the clock MUX5 is referred to as a "reference clock 2".

Each of the generation units 6a to 6f supplies a clock to a corresponding functional block from among a plurality of functional blocks. In the example in FIG. 1, the generation units 6a, 6b, 6e, and 6f respectively supply clocks to the functional blocks 7a, 7b, 7e, and 7f. Also, the generation units 6c and 6d supply a clock to a control unit 9 and the CPU 8 that are functional blocks. Therefore, the generation units 6a to 6f generates clocks to be supplied to functional blocks. The clocks that have been generated by the generation units 6a to 6f, and are to be supplied to functional blocks are respectively referred to as "clocks a to f".

The generation units 6a to 6f generate clocks to be supplied to functional blocks using a reference clock (for example, the reference clock 1 or the reference clock 2). For example, the generation units 6a and 6b from among the plurality of generation units supply clocks generated using the common reference clock 1, to the functional blocks 7a and 7b that are corresponding functional blocks. The generation units 6a to 6f can supply clocks to the functional blocks after decreasing the frequency of a reference clock by frequency-dividing the reference clock. Also, the generation units 6a to 6f can switch on/off clocks to be supplied to the functional blocks.

The control units 31 to 33 control clock generation that is performed by the generation units 6a to 6f. In the example in FIG. 1, the control unit 31 controls clocks that are supplied by the generation units 6a and 6b that form a group corresponding to the control unit 31. Similarly, the control unit 32 controls clocks that are supplied by the generation units 6c to 6e that form a group corresponding to the control unit 32, and the control unit 33 controls a clock that is supplied by the generation unit 6f that forms a group corresponding to the control unit 33.

In this embodiment, the control units 31 to 33 can control the frequencies of clocks to be supplied to the functional blocks by the generation units 6a to 6f, and perform control for switching on or off the supply of clocks from the generation units 6a to 6f to the functional blocks, but the control is not limited thereto. Note that, in the present specification, the control units 31 to 33 may be referred to as "first control units".

The control unit 9 transfers, to the control units 31 to 33, control information of clock generation that is performed by the generation units 6a to 6f. Specifically, the control unit 9 transfers, to the control unit 31, control information of clock generation that is performed by the generation units 6a and 6b that belong to the group corresponding to the control unit 31. Similarly, the control unit 9 transfers, to the control unit 32, control information of clock generation that is performed by the generation units 6c to 6e that belong to the group corresponding to the control unit 32, and transfers, to the control unit 33, control information of clock generation that is performed by the generation unit 6f that belongs to the group corresponding to the control unit 33. In this manner, the control unit 9 controls clocks to be supplied to the functional blocks via the control units 31 to 33.

The control unit 9 can include a register that stores setting values of frequencies of clocks to be generated by the generation units 6a to 6f and setting values indicating on or off of clocks. The control unit 9 can supply these setting values stored in the register to the control units 31 to 33, for example. Note that the CPU 8 may read/write setting values stored in the register by the control unit 9, via a register bus. In this manner, the CPU 8 can control clocks to be supplied to functional blocks. Note that, in the present specification, the control unit 9 may be referred to as a "second control unit".

A reset unit 20 generates a reset signal in the information processing apparatus 100. The reset unit 20 can operate using a low-speed clock generated by the oscillator 1, and, in this case, a reset signal output by the reset unit 20 is synchronized with a low-speed clock. Counters and FFs (to be described later) of the generation units 6a to 6f are initialized in accordance with this reset signal. In addition, the functional blocks 7a to 7f, the CPU 8, the control unit 9, and the control units 31 to 33 may be initialized at the same time in accordance with this reset signal (not illustrated).

At the time of reset execution, the clock MUXs 4 and 5 can select a low-speed clock generated by the oscillator 1. At this time, all of the units of the information processing apparatus 100 operate in synchronization with the low-speed clock. After reset cancellation, when the information processing apparatus 100 starts regular processing, the clock MUXs 4 and 5 can select high-speed clocks generated by the PLL 2 and the PLL 3. Accordingly, the information processing apparatus 100 can perform high-speed processing.

Next, an example of a detailed configuration of the generation units 6a to 6f will be described. The generation unit 6a will be described below, but the generation units 6b to 6f can also have an equivalent configuration. In FIG. 1, the generation unit 6a generates a clock whose frequency is reduced, by reducing the number of pulses of the reference clock 1. For example, in the generation unit 6a, the frequency can be reduced to ½ by removing every second pulse of the reference clock 1, and the frequency can be reduced to ¼ by removing three out of every four pulses of the reference clock 1. The pulse width of a clock generated by such a method (also referred to as "pulse thinning method") is the same as the pulse width of the reference clock.

The generation unit 6a includes a counter 61a and a frequency division circuit, and operates using the reference clock 1. In the example in FIG. 1, the frequency division circuit includes a decoder 62a, a flip flop (FF) 63a, and a gated clock buffer (GCB) 64a.

The counter 61a performs a count operation, and holds a count value. The count value is initialized to 0 at the time of reset. The counter 61a starts counting up after reset cancellation, and then continues counting up without stopping. When the count value reaches a predetermined expire value, the next count value falls to 0, and counting up is started again. In this manner, in an embodiment of the present invention, the reset unit 20 can initialize the counter values of counters (the counters 61a and 61b, etc.,) of a plurality of respective generation units (the generation units 6a and 6b, etc.,) at the same time. In addition, the reset unit 20 can also start operations of the initialized counters (the counters 61a and 61b, etc.,) of the respective generation units (the generation units 6a and 6b, etc.,) at the same time.

The frequency division circuit frequency-divides the reference clock 1 based on the value of the counter 61a. The frequency division circuit then supplies the clock a generated through frequency division, to the corresponding functional block 7a. Here, the frequency division circuit can generate the clock a in accordance with control performed by the control unit 31.

In the example in FIG. 1, the decoder 62a generates a timing signal that indicates a timing for thinning the pulse of the reference clock 1 in accordance with the count value of the counter 61a. Here, the decoder 62a can generate this signal additionally in accordance with a setting value 51a of the clock frequency that is input from the control unit 31.

The FF 63a latches a timing signal generated by the decoder 62a, and inputs the latched timing signal to the GCB 64a.

The GCB 64a generates the clock a whose frequency is lower than the frequency of the reference clock 1 by thinning the pulse of the reference clock 1 in accordance with a timing signal that has been input. For example, the GCB 64a can reduce the frequency to ½ by removing every second pulse of the reference clock 1, and can reduce the frequency to ¼ by removing three out of every four pulses. In addition, the GCB 64a can also output the clock a that has the same frequency as the reference clock 1, without thinning the pulse of the reference clock 1. Furthermore, the GCB 64a can also switch on or off the clock a in accordance with a setting value 50a that indicates on or off of a clock that is input from the control unit 31.

Synchronous groups in the information processing apparatus 100 will be described below. In the example in FIG. 1, data is passed/received between the functional block 7a and a functional block 7b(not illustrated), and thus clocks with the same phase are supplied to the functional blocks 7a and 7b. The functional blocks 7a and 7b to which clocks with the same phase are supplied in this manner are grouped as a synchronous group 11, in the present specification. Similarly, the CPU 8, the control unit 9, and the functional block 7e are grouped as a synchronous group 12, and the functional block 7f is grouped by itself as a synchronous group 13. Accordingly, the control units 31 to 33 respectively control clocks of the corresponding synchronous groups 11 to 13. In the present specification, functional blocks grouped as the same synchronous group in this manner are referred to as "functional blocks in synchronization relationship". In an embodiment of the present invention, a plurality of functional blocks in synchronization relationship are configured such that synchronous data transfer is performed between the plurality of functional blocks. Note that passing/receiving of data in synchronization with a clock is not performed between different synchronous groups, and thus the phases of clocks that are supplied do not need to be the same.

In addition, as shown in FIG. 1, clock trees 40a to 40f can be formed between the generation units and the functional blocks so as to make the phases of clocks the same, even if there is a clock delay due to the length of an interconnect from a generation unit that generates a clock to a functional block and the like. For example, the clock tree 40a is formed between the generation unit 6a and the functional block 7a, and the clock tree 40b is formed between the generation unit 6b and the functional block 7b, respectively on interconnects for delivering the clocks a and b. Specifically, routing is implemented to equalize the clock delay time between the clock tree 40a of the clock a and the clock tree 40b of the clock b, which belong to the same synchronous group 11, and a CTS buffer is inserted as necessary. The same applies to the clock trees 40c to 40e corresponding to clocks c to e, which belong to the synchronous group 12.

Here, the control unit 9 is positioned downstream of the clock tree 40c of the clock c. On the other hand, the control units 31 and 32 are positioned upstream of the clock tree 40c, and operate using the reference clock 1. Therefore, there is a large clock skew between the control unit 9 and the control units 31 and 32, and there is no guarantee of the phases of the clock c and the reference clock 1 being the same. In addition, the control unit 33 operates using the reference clock 2 of a clock system different from the clock c. Therefore, there is no guarantee of the phases of the clock c and the reference clock 2 being the same as well.

First Embodiment

An information processing apparatus according to a first embodiment of the present invention includes a plurality of functional blocks that are in synchronization relationship and a plurality of generation units. Each of the plurality of generation units includes a counter and a frequency division circuit for frequency-dividing a reference clock based on the value of the counter, and supplies a clock to a corresponding functional block from among the plurality of functional blocks. According to such a configuration, it is easy to suppress the difference in clock delay of clocks that are supplied to the plurality of function units. Such a configuration will be described below.

The configuration according to the first embodiment can be realized using the information processing apparatus 100 shown in FIG. 1, for example, using the functional blocks 7a and 7b and the generation units (and 6b. Accordingly, the plurality of generation units 6a and 6b belong to the same synchronous group 11, and are in synchronization relationship. In addition, the generation units 6a and 6b respectively include the counters 61a and 61b and the frequency division circuits (decoders 62a and 62b, FFs 63a and 63b, and GCBs 64a and 64b) for frequency-dividing a reference clock based on the values of the counters. Moreover, the generation units 6a and 6b respectively supply clocks to the corresponding functional blocks 7a and 7b from among a plurality of functional blocks. On the other hand, it is not necessary to use all of the constituent elements shown in FIG. 1.

In this embodiment, although the functional blocks 7a and 7b are in synchronization relationship, clocks generated by the generation units 6a and 6b different from each other are respectively supplied to the functional blocks 7a and 7b. By adopting such a configuration, the generation units 6a and 6b can be respectively arranged in the vicinity of the corresponding functional blocks 7a and 7b. For example, one of the plurality of generation units 6a and 6b can be arranged to be closer to a corresponding functional block than the other functional block. In addition, a clock line for supplying a clock from one of the plurality of generation units 6a and 6b to the corresponding one out of the functional blocks 7a and 7b can be made shorter than a clock line for supplying the reference clock 1 from the clock MUX 4 to this one of the generation units 6a and 6b. Therefore, it is possible to shorten clock routing from the generation units 6a and 6b to the functional blocks 7a and 7b. Furthermore, it is also possible to use a common clock line that extends to the vicinity of the functional blocks 7a and 7b in order to supply the reference clock 1. Such a configuration makes it possible to reduce the influence of difference in clock delay. In addition, by adopting the configuration of this embodiment and shortening clock routing, it is easy to achieve timing convergence between the functional blocks 7a and 7b.

Figure 2:
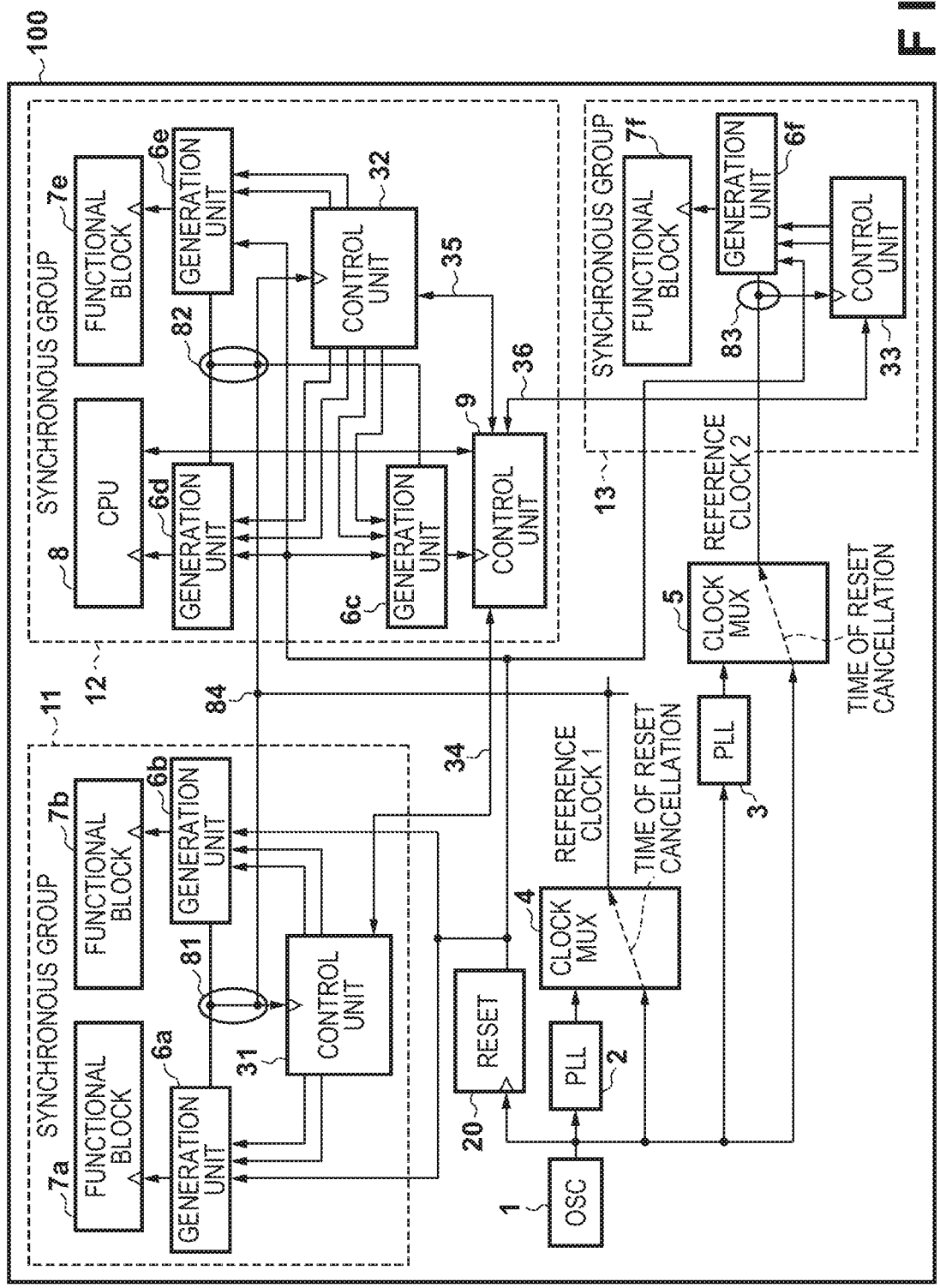
FIG. 2 is a diagram of a system configuration of an information processing apparatus according to an embodiment of the present invention.

FIG. 2 shows an example of physical layout of an LSI that realizes an information processing apparatus according to this embodiment, in such a configuration. As shown in FIG. 2, processing units that belong to the synchronous group 11 can be arranged to be physically brought together. Specifically, in FIG. 2, the functional blocks 7a and 7b that belong to the synchronous group 11 are arranged adjacent to each other in the area of the synchronous group 11. In addition, the generation unit 6a that supplies a clock to the functional block 7a is arranged in the vicinity of the functional block 7a, and, similarly, the generation unit 6b is arranged in the vicinity of the functional block 7b.

In an embodiment of the present invention, a clock line for supplying the reference clock 1 from the clock MUX 4 to the plurality of generation units 6a and 6b branches in the vicinity of the plurality of generation units 6a and 6b. For example, in FIG. 2, the reference clock 1 is distributed to the generation units 6a and 6b through an interconnect branched at a branch point 81 that is in the vicinity of the generation units 6a and 6b. As a specific example, the clock line extending from the branch point 81 to the generation unit 6a and the clock line extending from the branch point 81 to the generation unit 6b may be shorter than the clock line extending from a processing unit (for example, the clock MUX 4) that supplies the reference clock 1 to the branch point 81. In addition, as shown in FIG. 2, the clock line for supplying the reference clock 1 to the additional functional block 7e that is different from the functional blocks 7a and 7b may branch at a branch point 84 from the clock line for supplying the reference clock 1 to the plurality of generation units 6a and 6b. In this configuration, the clock line for supplying the reference clock 1 from the clock MUX 4 to the plurality of generation units 6a and 6b may branch at the branch point 81 downstream of the branch point 84. According to such a configuration, clock routing after the branch for a clock to be supplied to the functional blocks 7a and 7b is made short, and thus it is easy to achieve timing convergence between the functional blocks 7a and 7b.

In an embodiment of the present invention, the control unit 31 may control clocks that are supplied to the functional blocks 7a and 7b of the synchronous group 11. Specifically, the control unit 31 can control clock generation that is performed by the plurality of generation units 6a and 6b. Here, a configuration may be adopted in which one control unit 31 controls the plurality of generation units 6a and 6b. According to such a configuration, it is easy to synchronize control of the clocks a and b that are respectively supplied to the functional blocks 7a and 7b. In this case, the control unit 31 can be arranged in the area of the synchronous group 11, in other words, in the vicinity of the functional blocks 7a and 7b. The control unit 31 may operate using the reference clock 1 that is common with the plurality of generation units 6a and 6b. For example, the reference clock 1 may be distributed to the control unit 31 through the routing that branches in the vicinity of the control unit 31, for example, through the routing that branches at the above-mentioned branch point 81. According to such a configuration, timing convergency between the control unit 31 and the generation units 6a and 6b improves.

Similarly, the CPU 8, the control unit 9, and the functional block 7e that belong to the synchronous group 12, the generation units 6c to 6e that supply clocks to those belong to the synchronous group 12, and the control unit 32 that controls the generation units 6c to 6e may be arranged to be physically brought together. The same applies to the synchronous group 13.

Figure 3:
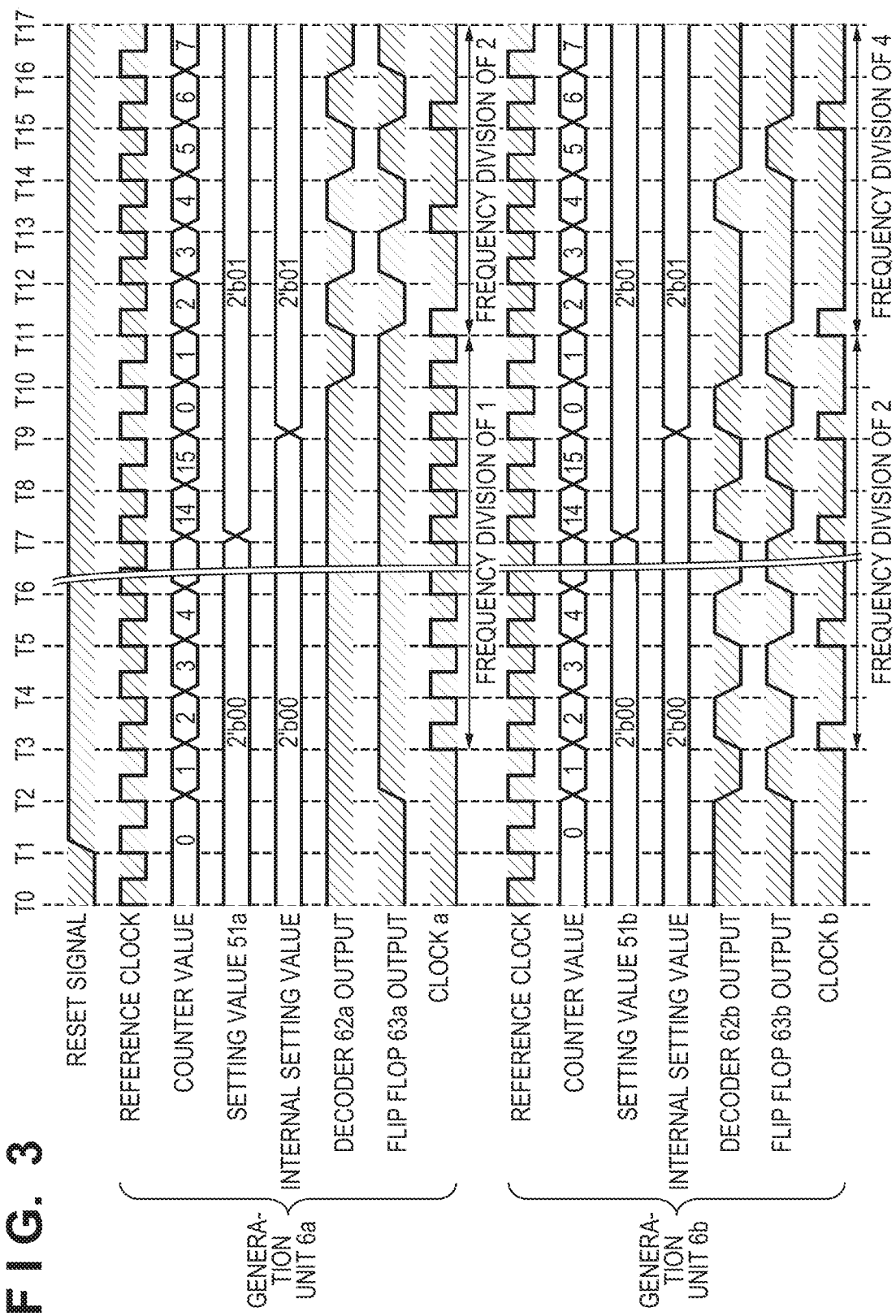
FIG. 3 is a timing chart of switching the clock frequency according to an embodiment of the present invention.

Operations of the generation units 6a and 6b when the information processing apparatus 100 shown in FIG. 1 is used in the first embodiment will be described below with reference to FIGS. 3 and 4. FIG. 3 is a timing chart showing a switch operation of a clock frequency that is performed by the generation units 6a and 6b.

In the following example, the counters 61a and 61b respectively provided in the plurality of generation units 6a and 6b are configured to operate in synchronization. For example, the counter values of the counters 61a and 61b can be incremented at the same timing. In the example in FIG. 1, the bit widths of the counters 61a and 61b of the respective generation units 6a and 6b are the same. Here, a bit width of a counter refers to the number of bits of the counter value, and may correspond to the maximum value of the count value. In addition, the counters 61a and 61b of the respective generation units 6a and 6b may wrap around at the same time (accordingly, the count values may return to 0 at the same time). Furthermore, the counters 61a and 61b of the respective generation units 6a and 6b may also be configured to indicate the same counter value. According to such a configuration, it is easily to synchronize the clocks a and b that are supplied to the functional blocks 7a and 7b. Here, both the counters 61a and 61b of the generation units 6a and 6b are 4-bit counters, and can count up to 15 at most.

In addition, in the following example, assume that, due to the characteristic of circuits of the functional blocks 7a and 7b, and the like, there is a constraint that the following frequency relationship always needs to be complied with, between the frequency of the clock a and the frequency of the clock b.

frequency of clock a>frequency of clock b

At time T0, the information processing apparatus 100 is in a reset state, the counters 61a and 61b are stopped, and the counter values are 0. The setting values 50a and 50b that indicate on or off of a clock are set on the side where a clock is output. In addition, the initial values of the FFs 63a and 63b are Low, and output clocks are stopped.

Furthermore, both the initial values of internal setting values (hereinafter, simply referred to as "internal setting values") are 2'b00. Here, the internal setting values are values obtained as a result of the decoders 62a and 62b latching the setting values 51a and 51b of the clock frequency that have been output by the control unit 31. The decoders 62a and 62b latch the setting values 51a and 51b at the timing when the count values of the counters 61a and 61b wrap around from 15 to 0. Regarding internal setting values of the generation unit 6a, 2'b( ) indicates a frequency division of 1, 2'b01 indicates frequency division of 2, 2'b10 indicates frequency division of 4, and 2'b11 indicates frequency division of 8. On the other hand, regarding internal setting values of the generation unit 6b, 2'b00 indicates frequency division of 2, 2'b01 indicates frequency division of 4, 2'b10 indicates frequency division of 8, and 2'b11 indicates frequency division of 16. Therefore, in an initial state, the clock a is set to the reference clock 1 subjected to frequency division of 1, and the clock b is set to the reference clock 1 subjected to frequency division of 2. Note that a clock frequency setting value is not limited to a 2-bit signal. In addition, the relationship between an internal setting value and a frequency division ratio is not limited to the above-described example as well, and can be defied suitably.

At time T1, reset is cancelled. At time T2, the counters 61a and 61b start counting up at the same time. In addition, the FFs 63a and 63b respectively latch output values of the decoders 62a and 62b, and outputs of the FFs 63a and 63b rise to High.

At time T3, outputs of the FFs 63a and 63b are High, and thus the GCBs 64a and 64b start output of clocks. In addition, the decoder 62a constantly outputs a High signal in accordance with the internal setting value that indicates frequency division of 1. On the other hand, the decoder 62b outputs a signal that repeats High and Low so as to form a High duration in one cycle out of two cycles in accordance with an internal setting value that indicates frequency division of 2. As a result, pulses in one cycle out of two cycles are thinned, and frequency division of 2 is realized. At times T4 to T8, similar operations are performed.

On the other hand, at time T7, both the setting values 51a and 51b that are input to the control unit 31 are switched from 2'b00 to 2'b01. This switch may be made, for example, by the CPU 8 rewriting data in the register of the control unit 9, and the control unit 9 transferring a setting value in the register to the control unit 31. Naturally, a method for switching a setting value in the first embodiment is not particularly limited.

At time T8, the count values of the counters 61a and 61b both count up to 15 which is the maximum count value, and both wrap around to 0 at time T9. On the wrapping around of the counters 61a and 61b, the internal setting value switches from 2'b00 to 2'b01. Therefore, a clock frequency that is output by the generation unit 6a is changed from frequency division of 1 to frequency division of 2, and a clock frequency that is output by the generation unit 6b is changed from frequency division of 2 to frequency division of 4. Accordingly, from time T9, the decoder 62a outputs a signal that changes to High and Low every cycle, that is, the period thereof corresponds to two cycles, and after the FF 63a latches the signal at time T10, the generation unit 6a starts output of a clock subjected to frequency division of 2 from time T11. In addition, from time T9, the decoder 62b outputs a signal that rises to High only in one cycle out of four cycles, and, from time T11, the generation unit 6b starts output of a clock subjected to frequency division of 4.

According to such a configuration, the counters 61a and 61b of the generation units 6a and 6b are synchronized and operate in the same manner, and thus the switch timings of clock frequencies can be set to be the same. Therefore, clock control can be performed in compliance with the above-mentioned constraint of the frequency relationship of clock frequencies. Naturally, when a clock is supplied to a plurality of functional blocks that are in synchronization relationship, it is not necessary to change clock frequencies at the same timing.

Figure 4:
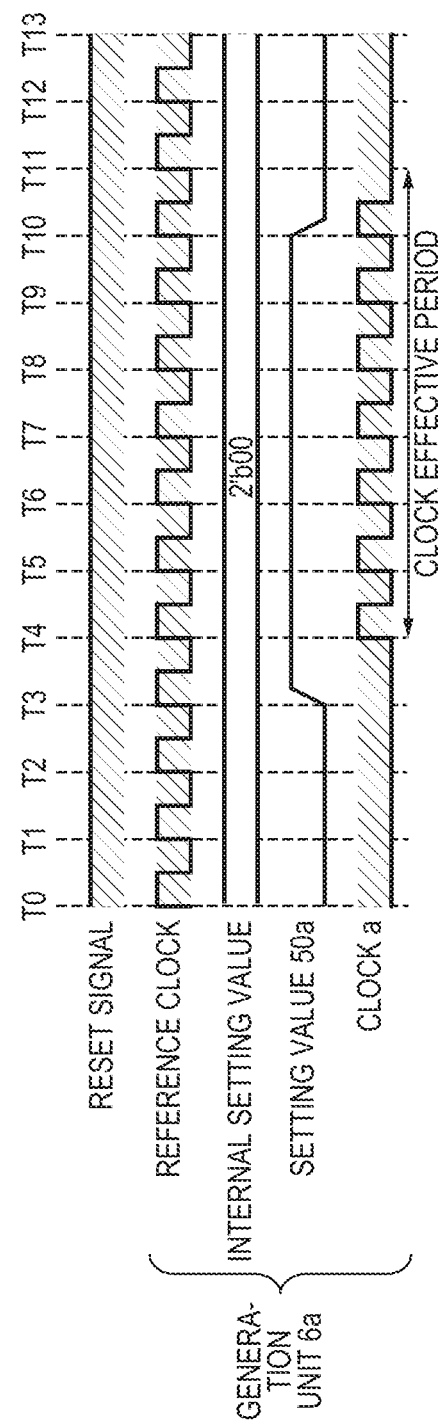
FIG. 4 is a timing chart of an on/off operation of clocks according to an embodiment of the present invention.

FIG. 4 is a timing chart showing an operation of switching on/off a clock frequency that is performed by the generation unit 6a. Note that the generation unit 6b and the other generation units 6c to 6f can operate similarly to the generation unit 6a.

At time T0, the information processing apparatus 100 is in a state where reset is cancelled. Here, the internal setting value of the generation unit 6a indicates 2'b00, in other words, the generation unit 6a is set to output a clock obtained by frequency-dividing the reference clock 1 by 1. However, the setting value 50a that is output by the control unit 31 and indicates on or off of a clock indicates Low, and thus the clock a that is an output clock from the generation unit 6a is stopped. Here, the setting value 50a represents a High active signal, specifically, High indicates "clock on", and Low indicates "clock of".

At time T3, the control unit 31 changes the setting value 50a to High. At time T4, the setting value 50a is High, and thus the GCB 64a starts output of the clock a. At time T10, the control unit 31 changes the setting value 50a to Low. Therefore, the clock a stops at time T11. Note that the setting value 50a can be switched similarly to the setting value 51a. Note that, even while the clock a is stopped, the counter 61a can continue a count operation.

Note that, as in the above-described example, the maximum division ratio of a clock generated by the generation unit 6a and the maximum division ratio of a clock generated by the generation unit 6b may be different. On the other hand, the maximum division ratio of the generation unit 6a refers to frequency division of 8, and it is sufficient that a counter of a 3-bit width (the maximum count value: 7) is used for outputting a clock subjected to frequency division of 8. Also, the maximum division ratio of the generation unit 6b refers to a frequency division of 16, and a 4-bit width counter (the maximum count value: 15) is used for outputting a clock subjected to frequency division of 16. In the above-described example, the counter width of the counter 61a of the generation unit 6a is a 4-bit width that is larger than the necessary 3-bit width so as to be the same counter width as the counter 61b of the generation unit 6b. According to a simple configuration in which the counter widths of the counters 61a and 61b are set to be the same in this manner, and the counters 61a and 61b are caused to wrap around at the same time, behaviors of the counters 61a and 61b can be made always the same. Therefore, according to the above-described example, clock frequencies can be easily switched at the same time. Naturally, in another example, a configuration may also be adopted in which the generation units 6a and 6b are independently controlled.

In the above-described example, the pulse thinning method for thinning pulses is used as a method for frequency-dividing a clock, but a frequency division method that can be used is not limited to a specific method. For example, a technique for using, as a frequency division clock, Q output of each bit of a down counter of a generation unit (which is also called frequency division technique) may be adopted as a frequency division method. In this case, for example, a frequency is reduced to ½ in Q output of the first digit bit of the counter, and a frequency is reduced to ¼ in Q output of the second digit bit. In this case, an MUX for selecting one of the frequency division clocks of the bits of the down counter can be used in place of a decoder of a generation unit. When a frequency division method is used, the pulse width of a clock generated by a generation unit increases in proportion to a frequency division ratio. For example, in a case of frequency division of 2, the pulse width is twice as large as that of a reference clock, and, in a case of frequency division of 4, the pulse width is four times larger than that of a reference clock. According to the configuration of the first embodiment, various frequency division methods can be applied.

In the above-described example, a case has been described in which the frequency of the reference clock is the same fixed frequency in a reset state and after reset cancellation. On the other hand, in an embodiment of the present invention, while the clock MUX 4 is supplying a low-speed clock as the reference clock 1, the reset unit 20 can start operations of the initialized counters 61a and 61b of the respective generation units 6a and 6b. Then, after operations of the counters 61a and 61b have been started, the reset unit 20 can supply a high-speed clock as the reference clock 1. The reference clock 1 may also be switched from a low-speed clock to a high-speed clock using the clock MUX 4 after reset cancellation in this manner. According to such a configuration, it is easier to implement timing design for synchronizing operations of the counters 61a and 61b. When a reference clock is switched to a high-speed clock, the period of one cycle is shorter than in the case of a low-speed clock, but the behavior of the signal does not change.

In the above example, it is assumed that the counters constantly continue counting up after reset cancellation, and the count values of the counters 61a and 61b are continuously synchronized. However, there is the possibility that synchronization of the counter values will be lost due to an external factor such as cosmic rays. In order to handle such an event, an information processing apparatus according to an embodiment of the present invention may further include a configuration for detecting synchronization deviation between the counters (61a, 61b) of the respective generation units 6a and 6b. In this case, the reset unit 20 can initialize the counter values of the counters 61a and 61b of the respective generation units 6a and 6b according to synchronization deviation having been detected.

As an example of such a configuration, the counters 61a and 61b may also include a check circuit for confirming whether or not the counter values have been incrementing one by one. If the check circuit detects an abnormality, in other words, that the counter values have not been incrementing one by one, the counters can notify the reset unit 20 of the abnormality. In this case, the reset unit 20 can switch a reference clock to be supplied to all of the generation units that generate clocks for the same synchronous group as the counter that performed notification, to a low-speed clock generated by the oscillator 1, and perform reset. According to such a configuration, the counters of all of the generation units that generate clocks for the same synchronous group can be initialized, and the counters can count up from 0 at the same time, in other words, the counter values can be synchronized.

Second Embodiment

An information processing apparatus according to a second embodiment of the present invention includes a plurality of generation units, a first control unit, and a second control unit. The plurality of generation units respectively generate clocks to be supplied to corresponding functional blocks from among a plurality of functional blocks. The first control unit controls clock generation that is performed by generation units belonging to a first group from among a plurality of generation units, and operates using a clock that is common in the first group. Also, the second control unit is one of the plurality of functional blocks, and asynchronously transfers, to the first control unit, control information of clock generation that is performed by the first group. According to such a configuration, it is easy to achieve timing design for the second control unit to control the generation units. Such a configuration will be described below.

The configuration according to the second embodiment can be realized using the information processing apparatus 100 shown in FIG. 1, for example, the plurality of generation units 6a and 6b, the control unit 31, and the control unit 9. Specifically, the plurality of generation units 6a and 6b respectively generate clocks to be supplied to the corresponding functional blocks 7a and 7b from among a plurality of functional blocks. The control unit 31 controls clock generation performed by the generation units 6a and 6b that constitute the first group from among a plurality of generation units, and operates using a clock that is common with the generation units 6a and 6b that constitute the first group. The generation units 6a and 6b that constitute this first group may supply generated clocks to the plurality of functional blocks 7a and 7b that are in synchronization relationship with each other. The control unit 9 is one of a plurality of functional blocks, and asynchronously transfers, to the control unit 31, control information of clock generation performed by the generation units 6a and 6b that constitute the first group. In the example in FIG. 1, a second group of generation units (the generation units 6c to 6e) in which clock generation is controlled by the control unit 32 supplies generated clocks to the control unit 9. Here, the second group operates using the reference clock 1 that is common with first group. On the other hand, it is not necessary to use all of the constituent elements shown in FIG. 1. In addition, the information processing apparatus according to the second embodiment may have the configuration of the information processing apparatus according to the first embodiment, but may be an information processing apparatus different from that in the first embodiment.

In this embodiment, the control unit 9 is connected to the control unit 31 via an I/F 34 that is an interface for asynchronous data transfer. The control unit 9 can asynchronously transfer control information of clock generation to the control unit 31 via the I/F 34. This control information may include at least one of information regarding the frequency of a clock generated by a generation unit and information for controlling on or off of a clock generated by a generation unit. For example, the control unit 9 can transfer, as control information of clock generation that is performed by the generation units 6a and 6b, the setting values 51a and 51b of clock frequencies for the generation units 6a and 6b and the setting values 50a and 50b indicating on or off of a clock.

Similarly, an information processing apparatus according to an embodiment of the present invention may also include the control unit 32 that controls clock generation that is performed by the second group constituted by one or more generation units (the generation units 6c to 6e) from among a plurality of generation units, and operates using a clock that is common with the second group. The control unit 9 can asynchronously transfer, to the control unit 32, control information of clock generation performed by the second group. In the example in FIG. 1, the control unit 9 is connected to the control units 32 and 33 via I/Fs 35 and 36 that are interfaces for asynchronous data transfer. In this case, the control unit 9 can asynchronously transfer setting values for the generation units 6c to 6e to the control unit 32, and a setting value for the generation unit 6f to the control unit 33.

Figure 5:
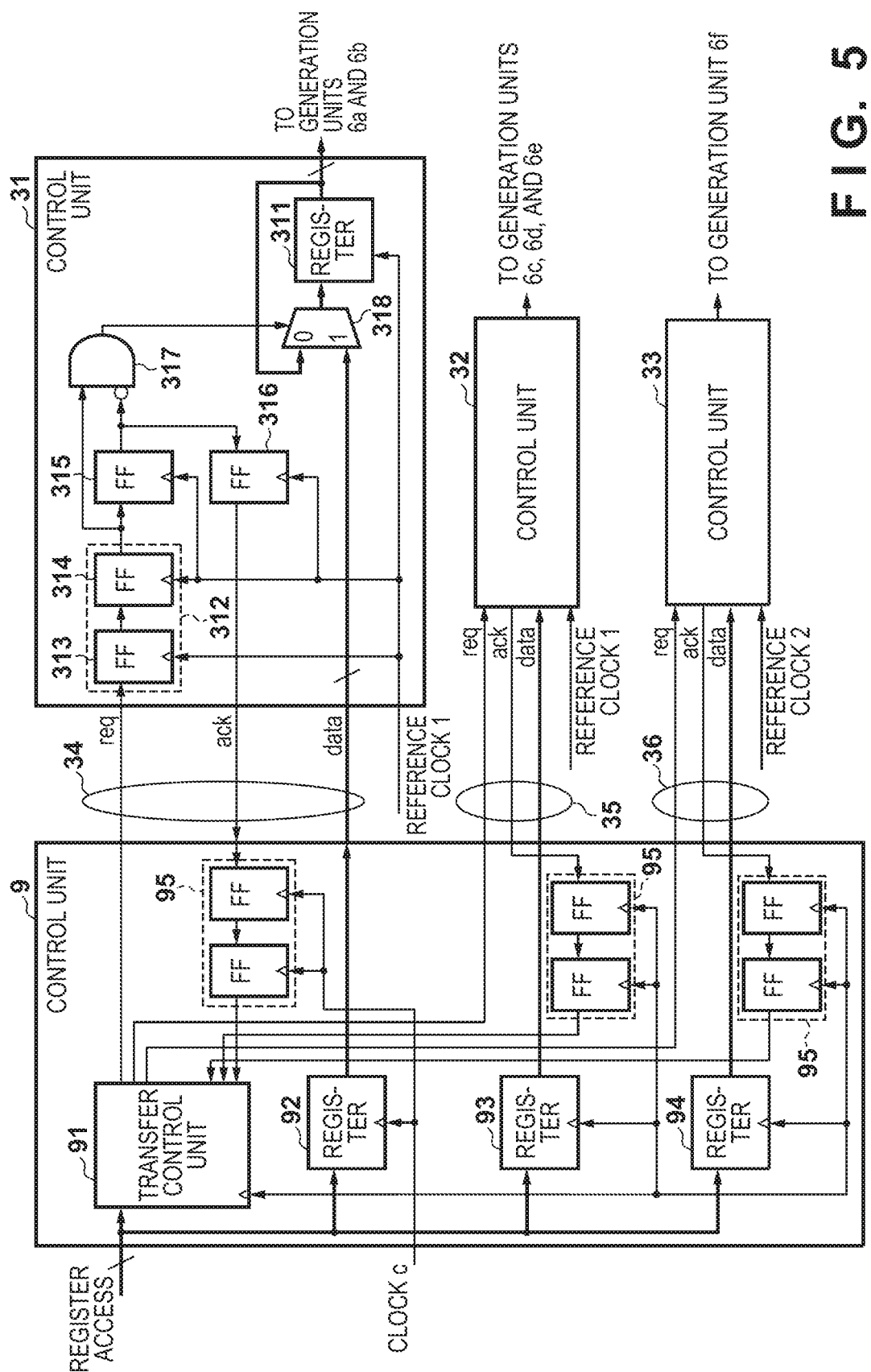
FIG. 5 is a diagram showing a configuration for asynchronous transfer in an information processing apparatus according to an embodiment of the present invention.

An example of a configuration of the control unit 9 and the control unit 31 for performing asynchronous transfer will be described with reference to FIG. 5. FIG. 5 is a block diagram showing an example of a configuration of the control unit 9 and the control unit 31. The control unit 9 includes a transfer control unit 91 and a register 92. The register 92 stores control information of clock generation for a synchronous group 11. Similarly, the control unit 9 may include registers 93 and 94 that store control information of clock generation for synchronous groups 12 and 13. The registers 92 to 94 have different address spaces for register access, and exclusively readable and recordable. The control information in these registers 92 to 94 can be rewritten by one of a plurality of functional blocks. For example, the CPU 8 may read/write data from/to the registers 92 to 94 via a register bus.

A case in which data has been written in the register 92 will be described below, but, also when data is written in the registers 93 and 94, a similar operation can be performed. In addition, in the following example, a case will be described in which the control unit 9 and the control unit 31 are connected by a bus, and the control unit 9 transfers control information to the control unit 31 via the bus.

In the example shown in FIG. 5, register access between the control unit 9 and the control unit 31 is performed using a bus protocol that uses an address signal and a data signal. In addition, in FIG. 5, the control unit 9 and the control unit 31 are further connected by signal lines (req, ack) for controlling transfer of control information.

When data is written in a register, the transfer control unit 91 determines which synchronous group the register, in which the data was written, belongs to, based on the address of the register access, and starts asynchronous data transfer to the corresponding control unit. First, the control unit 9 transmits, to the control unit 31, a signal for requesting acquisition of control information. In the example in FIG. 5, for example, if it is determined that data has been written in the register 92 for the synchronous group 11, the transfer control unit 91 asserts a request signal (req) to be transmitted to the I/F 34 for the control unit 31. On the other hand, the transfer control unit 91 outputs the register value of the register 92 as a data signal (data) to be transmitted to the IF 34.

The control unit 31 synchronizes input req, using a two-stage FF synchronizer 312 for coping with metastability that includes an FF 313 and an FF 314. The control unit 31 also generates a pulse that is a logical product 317 of Q output of the FF 314 indicating synchronized req and inversion of Q output of an FF 315. A register 311 then latches "data" of the I/F 34 in accordance with the generated pulse. The control unit 31 then transmits, to the control unit 9, a signal for performing notification that control information has been acquired. In the example in FIG. 5, the control unit 31 loops back the Q output of the FF 314 as a response signal (ack) to the I/F 34, via the FF 315 and the FF 316.

The control unit 9 synchronizes ack input from the IF 34, using a two-stage FF synchronizer 95. The synchronized ack is input to the transfer control unit 91. The transfer control unit 91 deasserts req in accordance with the synchronized ack being asserted. Ultimately, ack is also deasserted, and asynchronous data transfer is complete in this manner. A detailed operation example of asynchronous data transfer will be described later with reference to the timing chart in FIG. 7.

The control unit 31 outputs a data signal latched by the register 311, to the generation units 6a and 6b, as setting values for the generation units 6a and 6b (for example, the setting values 50s and 50b of clock frequencies and the setting values 51a and 51b indicating on or off of a clock). In the example described here, the control unit 31 asynchronously transfers control information (for example, the above-described setting values 50a, 50b, 51a, and 51b) to one or more generation units, namely the generation units 6a and 6b included in the first group. In addition, the control unit 31 can output control information to one or more generation units, namely the generation units 6a and 7b included in the first group, at the same timing.

The control units 32 and 33 can have a configuration for asynchronous data transfer similar to that of the control unit 31, and can latch the register values of the registers 93 and 94. In this manner, the transfer control unit 91 can be in charge of control all of the I/Fs 34 to 36 in a concentrated manner.

Figure 7:
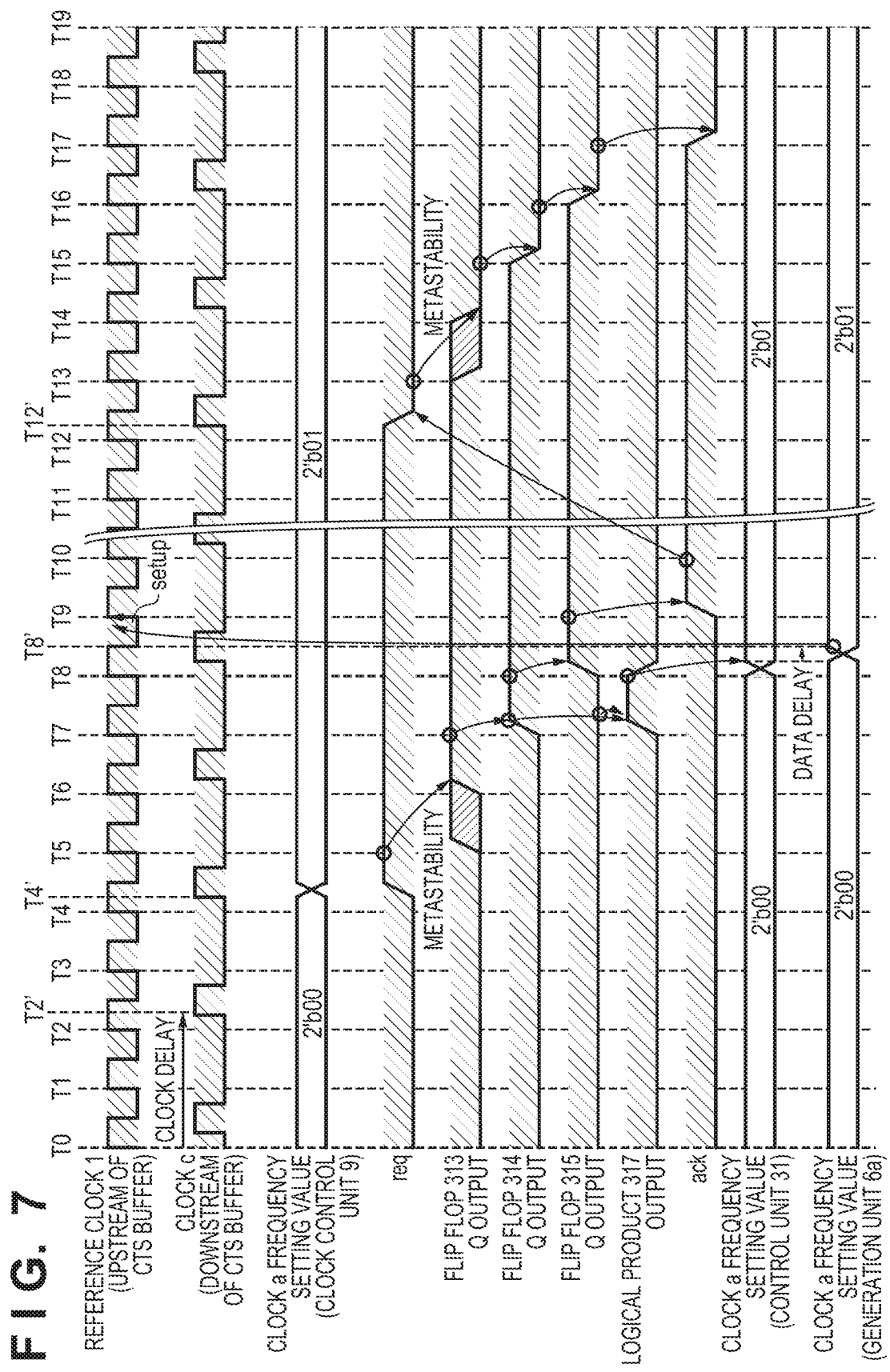
FIG. 7 is a timing chart of transfer of setting values according to an embodiment of the present invention.

Passing/receiving of the setting value of the frequency of the clock a will be described with reference to the timing chart in FIG. 7. Note that the setting value of the frequency of the clock b can be transferred similarly. In the following description, the control unit 9 operates in synchronization with the clock c, and the clock c is obtained by frequency-dividing the reference clock 1 by 2. The clock c is positioned downstream of the CTS buffer relative to the reference clock 1, and a pulse generated in accordance with the reference clock 1 at time T0 has delayed until time T2' due to clock delay of the CTS buffer, when the pulse reached the control unit 9. Due to this difference in clock delay, it is not easy to guarantee synchronization of the phases of the clock c and the reference clock 1.

At time T0, the setting value of the frequency of the clock a is 2'00 (frequency division of 1). This setting value is a value that has been input, as "data", to the control unit 31 via the I/F 34. At time T'4, as a result of the control unit 9 writing data to the register 92, the setting value of the frequency of the clock a held in the register 92 is changed from 2'b00 to 2b01 (frequency division of 2). At the same time, the transfer control unit 91 asserts req of the I/F 34. Here, assume that req and ack are High active signals, and asserting means "High".

At time T5, req asserted at time T4' is latched by the FF 313 of the control unit 31. However, the phases of the clock c that is a transmission clock and the reference clock 1 that is a receiving clock may not be synchronized. Therefore, metastability may occur at time T5. However, in this example, the two-stage FF synchronizer 312 is used, and thus metastability that occurred at time T5 converges at time T6, and Q output of the FF 313 rises to High. At time T7, this "High" propagates from the FF 313 to the FF 314. Then, the logical product 317 of inversion of Q output of the FF 315 and Q output of the FF 314 rises to High. The logical product 317 is High at time T8, and thus an MUX 318 selects "data" assigned to the node 1, and, for this reason, "data" is latched by the register 311.

The setting value 51*a* of a clock frequency that is based on "data" latched by the register 311 at time T8 reaches the generation unit 6*a* at time T8' due to data delay. This setting value 51*a* can be latched by the decoder 62*a* at time T9 when the reference clock 1 rises, at earliest. Timing design can be implemented using this timing path as a path for passing/receiving data in one cycle of the reference clock 1.

At time T9, the control unit 31 asserts ack of the I/F 34. The transfer control unit 91 that has received the asserted ack deasserts req at time T12'. At time T13, metastability may occur similar to time T5, but metastability converges at time T14, and the Q output of the FF 313 falls to Low. Subsequently, Low propagates to ack through time T17, and asynchronous data transfer is complete.

As described above, in the above example, asynchronous data transfer of control information of clock generation (for example, a setting value of a clock frequency and a setting value of on or off of a clock) can be performed from the control unit 9 downstream of the CTS buffer to the control unit 31 that is upstream of the CTS buffer and operates using the reference clock 1. Therefore, it is possible to separate a timing path extending from the control unit 9 downstream of the CTS buffer to the control unit 31 upstream of the CTS buffer. In an embodiment of the present invention, one or more generation units, namely the generation units 6*a* and 6*b* and the control unit 31 included in the first group operate using a clock upstream of a clock tree relative to the control unit 9 (including a clock that is not targeted for the clock tree). In this manner, even if an operation clock of the control unit 9 and operation clocks of the generation units 6*a* and 6*b* are not synchronized, in this embodiment, it is easy to transfer control information of clock generation from the control unit 9 to the generation units 6*a* and 6*b*. Accordingly, in this embodiment, it is sufficient that setting values can be transferred in synchronization between the control unit 31 and the generation units 6*a* and 6*b* that operate using a common clock, and thus it is easy to implement timing design.

Particularly, as described in the first embodiment, it is possible to reduce data delay that occurs from the control unit 31 to the generation units 6*a* and 6*b* by arranging the control unit 31 in the vicinity of the first group (the generation units 6*a* and 6*b*). For example, the control unit 31 can be arranged to be closer to the generation units 6*a* and 6*b* than all of the other generation units 6*c* to 6*f*. According to such a configuration, it is easy to implement timing design so as to pass control information of clock generation from the control unit 31 to the generation units 6*a* and 6*b* in one cycle of the reference clock 1.

Note that the control unit 9 may be included in any synchronous group. For example, the control unit 9 may be one of the functional blocks included in the synchronous group 11. In this case, the first group of generation units (the generation units 6*a* and 6*b*) can supply a generated clock to the control unit 9. In addition, the control unit 9 may be one of the functional blocks included in the synchronous group 13. In this case, the third group of generation units (the generation unit 6*f*) in which clock generation is controlled by the control unit 33 can supply a generated clock to the control unit 9, and, here, the third group operates using the reference clock 2 that is different from that of the first group.

Even if the control unit 31 and the control unit 9 operate using different reference clocks in this manner, it is easy to implement timing design for passing/receiving control information, by separating the timing path.

In addition, as described in the first embodiment, if there is a constraint of frequency relationship between clock frequencies generated by the generation units 6*a* and 6*b*, clock frequencies generated by the generation units 6*a* and 6*b* may need to be changed at the same time in order to prevent inconsistency of the frequency relationship. In this manner, the configuration of this embodiment is also effective to change clock frequencies at the same time. For example, in an embodiment of the preset invention, setting values of frequencies of both the clock a and the clock b are changed through one writing operation in a register. An example of a register field that can realize such a configuration will be described with reference to FIG. 6.

Figure 6:
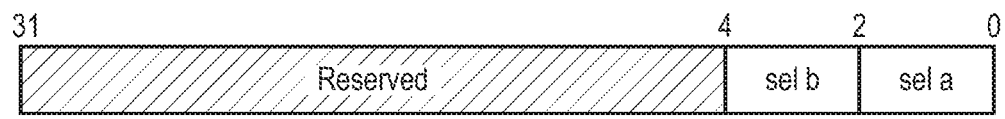
FIG. 6 is a diagram showing an example of a register field according to an embodiment of the present invention.

FIG. 6 shows the register 92. Data is read from/written to the register 92 in units of four bytes. Specifically, in FIG. 6, writing/reading data in/from 0th to 31st bits can be performed at the same time. A region indicated by "sel a" represents a setting value of the frequency of the clock a, and is assigned to 0th to 1st bits. Also, a region indicated by "sel b" represents a setting value of the frequency of the clock b, and is assigned to 2nd and 3rd bits. "Reserved" in 4th to 31st bits represents a region that is not used.

In such an embodiment, when the frequencies of the clock a and the clock b are changed, sel a and sel b are rewritten at the same time. In this case, the setting values of the frequencies of the clock a and the clock b, which are indicated by "data" output by the register 92 via the I/F 34, change at the same time. Therefore, change in the setting values of the frequencies of the clock a and the clock b are also reflected on a data signal stored in the register 311 at the same time. Therefore, the setting values 51*a* and 51*b* of the clock frequencies that are output by the register 311 are also changed at the same time. In this manner, the frequencies of the clock a and the clock b can be changed at the same time. A configuration for changing a clock frequency according to a setting value is not particularly limited, but, for example, if a configuration similar to that of the first embodiment is adopted, it is possible to change the frequencies of the clock a and the clock b at the same time by changing the setting values 51*a* and 51*b* at the same time.

In the second embodiment, a case has been mainly described in which a setting value of a frequency of a clock is changed, but, similarly, it is also possible to change a setting value of on or off a clock.

In this embodiment, the CPU 8 rewrites data in the register of the control unit 9 via the register bus, and asynchronously transfers control information of clock generation from the control unit 9 to the control unit 31. On the other hand, the CPU 8 may also asynchronously transfer control information of clock generation directly to the control unit 31. As described above, the control unit 31 can be provided for each synchronous group. For example, the CPU 8 can asynchronously transfer control information of clock generation to the control unit 31 by rewriting data in a register provided in the control unit 31 via a register bus that enables asynchronous bus transfer.

Further Embodiment

In FIG. 1, the generation units 6*a* to 6*f* are provided to achieve one-to-one relationship with functional blocks, but the present invention is not limited to such a configuration. Accordingly, one generation unit may supply a clock to two or more functional blocks. In this case, it is possible to provide the generation unit that generates a clock to be supplied to a plurality of functional blocks such that delay difference of clock routing on a chip top layer between the generation unit and the functional blocks does not affect timing design, in light of the layout of the functional block.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory apparatus, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-080468, filed Apr. 19, 2019, which is hereby incorporated by reference herein in its entirety.

What is claimed is:

1. An information processing apparatus comprising:
a plurality of functional blocks that are in synchronization relationship; and
a plurality of generation units each comprises a counter and a frequency division circuit, the frequency division circuit being configured to frequency-divide a reference clock based on a value of the counter, wherein each of the plurality of generation units is configured to supply a clock generated using the reference clock to a corresponding functional block among the plurality of functional blocks,
wherein a number of the plurality of generation units is the same as a number of the plurality of functional blocks, and
wherein each of the plurality of generation units is arranged closer to the corresponding functional block than the other generation units of the plurality of generation units.

2. The information processing apparatus according to claim 1,
wherein the counters of the plurality of generation units are configured to operate in synchronization.

3. The information processing apparatus according to claim 1,
wherein bit widths of the counters of the plurality of generation units are the same.

4. The information processing apparatus according to claim 1,
wherein the counters of the plurality of generation units are configured to wrap around at the same time.

5. The information processing apparatus according to claim 1,
wherein the counters of the plurality of generation units are configured to indicate the same counter value.

6. The information processing apparatus according to claim 1,
wherein the plurality of generation units comprise a first generation unit and a second generation unit, and a maximum division ratio of a clock that is generated by the first generation unit and a maximum division ratio of a clock that is generated by the second generation unit are different.

7. The information processing apparatus according to claim 1,
wherein the plurality of generation units are further configured to respectively supply a clock generated using a common reference clock to the corresponding functional blocks.

8. The information processing apparatus according to claim 1, further comprising
a reset unit configured to initialize counter values of the counters of the plurality of generation units at the same time.

9. The information processing apparatus according to claim 8,
wherein the reset unit is further configured to start operations of the initialized counters of the plurality of generation units at the same time.

10. The information processing apparatus according to claim 8, further comprising
a supply unit configured to supply, as the reference clock, a low-speed clock or a high-speed clock that is higher than the low-speed clock,
wherein the reset unit is further configured to, while the supply unit supplies the low-speed clock, start the operations of the initialized counters of the plurality of generation units, and
the supply unit is further configured to supply the high-speed clock as the reference clock after the operations of the counters are started.

11. The information processing apparatus according to claim 8, further comprising
a detection unit configured to detect synchronization deviation between the counters of the plurality of generation units,
wherein the reset unit is further configured to initialize counter values of the counters of the plurality of generation units in response to the detection unit detecting the synchronization deviation.

12. The information processing apparatus according to claim 1,
wherein the plurality of functional blocks are further configured such that synchronous data transfer is performed between the plurality of functional blocks.

13. The information processing apparatus according to claim 1, further comprising
a supply unit configured to supply the reference clock,
wherein a clock line for supplying the reference clock from the supply unit to the plurality of generation units branches in the vicinity of the plurality of generation units.

14. The information processing apparatus according to claim 1, further comprising:
a supply unit configured to supply the reference clock; and
an additional functional block different from the plurality of functional blocks,
wherein a clock line for supplying the reference clock from the supply unit to the additional functional block branches at a first branch point from a clock line for supplying the reference clock from the supply unit to the plurality of generation units, and
the clock line for supplying the reference clock from the supply unit to the plurality of generation units branches downstream of the first branch point.

15. The information processing apparatus according to claim 13,
wherein a clock line for supplying a clock from one of the plurality of generation units to a corresponding functional block is shorter than a clock line for supplying the reference clock from the supply unit to the one of the plurality of generation units.

16. The information processing apparatus according to claim 1,
wherein the plurality of generation units are respectively arranged in the vicinity of the corresponding functional blocks.

17. The information processing apparatus according to claim 1, further comprising
a control unit configured to control clock generation that is performed by the plurality of generation units.

18. The information processing apparatus according to claim 17,
wherein the control unit is configured to operate using the reference clock that is common with the plurality of generation units.

19. The information processing apparatus according to claim 16,
wherein each of the plurality of generation units is arranged closer to the corresponding functional block than the other generation units of the plurality of generation units.

20. The information processing apparatus according to claim 1,
wherein relative frequency relationship is configured for the frequencies of a plurality of clocks generated by the plurality of generation units.

* * * * *